(12) United States Patent
Zhou et al.

(10) Patent No.: US 9,265,169 B2
(45) Date of Patent: Feb. 16, 2016

(54) HOUSING AND ELECTRONIC DEVICE USING THE HOUSING

(71) Applicants: SHENZHEN FUTAIHONG PRECISION INDUSTRY CO., LTD., Shenzhen (CN); FIH (Hong Kong) Limited, Kowloon (HK)

(72) Inventors: Shu-Xiang Zhou, Shenzhen (CN); Jun Xiong, Shenzhen (CN)

(73) Assignees: SHENZHEN FUTAIHONG PRECISION INDUSTRY CO., LTD., Shenzhen (CN); FIH (Hong Kong) Limited, Kowloon (HK)

( * ) Notice: Subject to any disclaimer, the term of this patent is extended or adjusted under 35 U.S.C. 154(b) by 401 days.

(21) Appl. No.: 13/869,709

(22) Filed: Apr. 24, 2013

(65) Prior Publication Data

US 2014/0190739 A1    Jul. 10, 2014

(30) Foreign Application Priority Data

Jan. 7, 2013   (CN) .......................... 2013 1 0004424

(51) Int. Cl.
*H05K 5/04* (2006.01)
*C25D 11/24* (2006.01)
*H05K 5/02* (2006.01)

(52) U.S. Cl.
CPC *H05K 5/04* (2013.01); *C25D 11/24* (2013.01); *C25D 11/243* (2013.01); *C25D 11/246* (2013.01); *H05K 5/0243* (2013.01)

(58) Field of Classification Search
CPC ....... H05K 5/04; H05K 5/0243; C25D 11/24; C25D 11/243; C25D 11/246
See application file for complete search history.

(56) References Cited

U.S. PATENT DOCUMENTS

2003/0099844 A1* 5/2003 Hanahata ............. C09D 183/04
428/447

* cited by examiner

*Primary Examiner* — Michael C Miggins
(74) *Attorney, Agent, or Firm* — Novak Druce Connolly Bove + Quigg LLP

(57) ABSTRACT

A housing includes a substrate made of aluminum or aluminum alloy, an anodic oxide film disposed on the substrate, and an abrasion resisting layer disposed on the anodic oxide film. The abrasion resisting layer is an alkylate silicon dioxide layer containing nano aluminum oxide powder. An electronic device using the housing is also described.

6 Claims, 3 Drawing Sheets

HOUSING AND ELECTRONIC DEVICE USING THE HOUSING

BACKGROUND

1. Technical Field

The present disclosure relates to housings, especially to a housing having an excellent abrasion resistance, and an electronic device using the housing.

2. Description of Related Art

Aluminum or aluminum alloy (hereinafter "aluminum/aluminum alloy") are widely used to manufacture housings of electronic devices. However, aluminum/aluminum alloy is an active metal, and is prone to be oxidized in air to form an $Al_2O_3 \cdot H_2O$ film or an $Al_2O_3$ film having a thickness of about 0.01 μm-0.10 μm. The film is amorphous, and has a certain protection to the aluminum/aluminum alloy. However, the film cannot provide enough protection and/or decoration to the aluminum/aluminum alloy. So, the aluminum/aluminum alloy is often anodized to form an anodic layer thereon.

The anodic layer is a porous layer which is needs to be sealed to improve the hardness and abrasion resistance of the aluminum/aluminum alloy. The current method to seal the micro-pores of the aluminum/aluminum alloy is to use sealing agent such as boiling water, nickel acetate, nickel sulfate, potassium dichromate, or stearic acid. However, these sealing treatments cannot provide the anodic layer with a good abrasion resistance, thereby the anodic layer always loses color or fades over time.

Therefore, there is room for improvement within the art.

BRIEF DESCRIPTION OF THE DRAWING

Many aspects of the disclosure can be better understood with reference to the following figure. The components in the figure are not necessarily drawn to scale, the emphasis instead being placed upon clearly illustrating the principles of the disclosure. Moreover, in the drawings like reference numerals designate corresponding parts throughout the several views.

DETAILED DESCRIPTION

Figure 1:
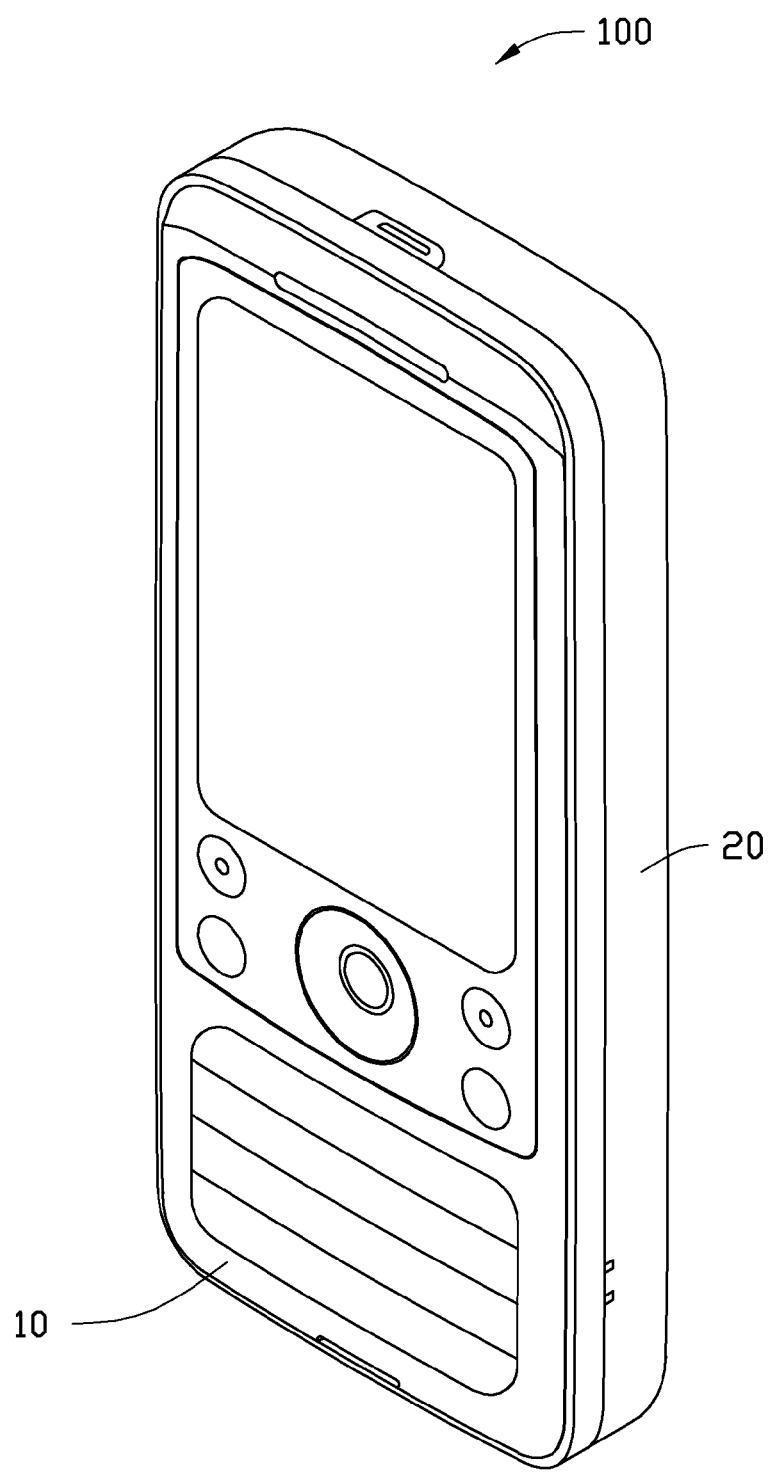
FIG. 1 is a schematic view of an electronic device in accordance with an exemplary embodiment.

FIG. 1 shows an electronic device 100 according to an exemplary embodiment. The electronic device 100 includes a main body 10, and a housing 20 configured to assemble with the main body 10. The main body 10 includes electrical elements and a displaying assembly (not shown) received in the main body 10.

Figure 2:
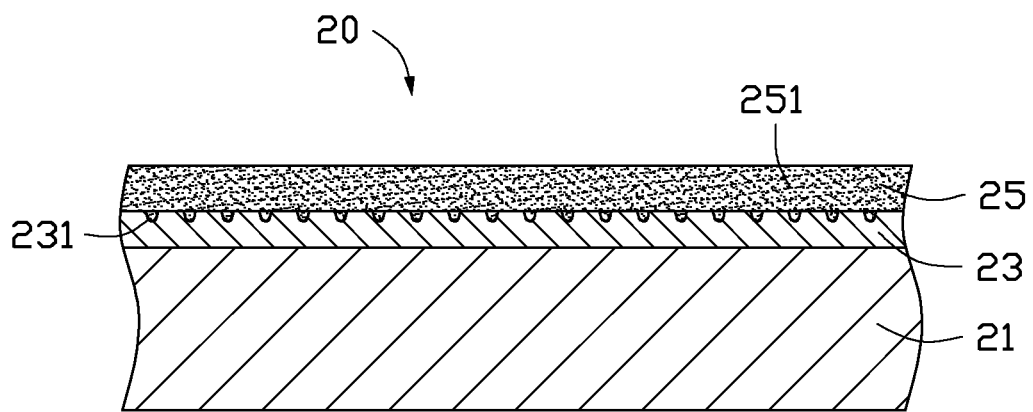
FIG. 2 is a partial cross-sectional view of a housing in accordance with an exemplary embodiment.
Figure 3:
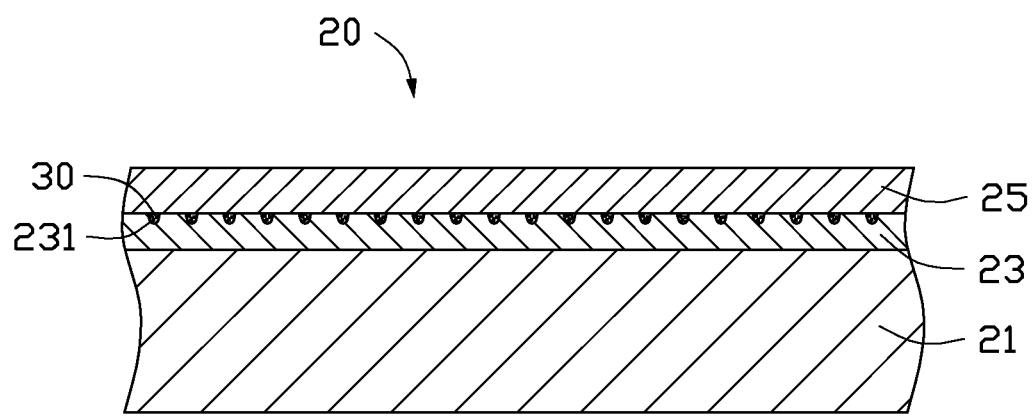
FIG. 3 is a partial cross-sectional view of a housing in accordance with another exemplary embodiment.

Referring to FIGS. 2 and 3, the housing 20 includes a substrate 21, an anodic oxide film 23 formed on the substrate 21, and an abrasion resisting layer 25 formed on the anodic oxide film 23.

The substrate 21 is made of aluminum or aluminum alloy.

The anodic oxide film 23 is formed by anodizing the substrate 21. The anodic oxide film 23 is porous and defines a plurality of micro-pores 231. The micro-pores 231 have an average diameter of about 2 μm to about 10 μm. The micro-pores 231 may be filled with colorant and sealing agent 30 (see FIG. 3) as mentioned in the description of related art, or not be filled with colorant and sealing agent 30.

The abrasion resisting layer 25 is an alkylate silicon dioxide layer having a high hardness. The abrasion resisting layer 25 may be formed by spraying a silane coupling agent water solution on the anodic oxide film 23. The silane coupling agent contains Si—OH groups which can perform a condensation reaction with the —OH groups at the surface of the anodic oxide film 23 to form Si—O—Si groups, thereby the abrasion resisting layer 25 is firmly attached on the anodic oxide film 23, such that the abrasion resistance of the abrasion resisting layer 25 and/or the housing 20 is improved. Furthermore, since the alkylate silicon dioxide layer has a high hardness, the abrasion resistance of the abrasion resisting layer 25 and/or the housing 20 is further enhanced.

The abrasion resisting layer 25 contains nano aluminum oxide ($Al_2O_3$) powder. The nano $Al_2O_3$ powder includes nano particles 251 (see FIG. 2) having an average diameter of about 30 nm to about 60 nm. The nano $Al_2O_3$ powder has a mass percentage of about 60% to about 85% in the abrasion resisting layer 25. The nano $Al_2O_3$ powder can fill the micro-pores 231 of the anodic oxide film 23 (when the micro-pores 231 are not filled with colorant and sealing agent 30) and attach on the anodic oxide film 23 (see FIG. 2). Because the nano $Al_2O_3$ powder contained in the abrasion resisting layer 25 can disperse external impact to the anodic oxide film 23 due to a nano structure effect, the abrasion resistance of the housing 20 is further improved. It is to be understood that, when the micro-pores 231 are filled with colorant and sealing agent 30, the nano $Al_2O_3$ powder only attaches on the anodic oxide film 23 (see FIG. 3).

The nano $Al_2O_3$ powder in the abrasion resisting layer 25 may be modified by aluminate ester coupling agent. The modification makes the nano $Al_2O_3$ powder evenly distribute in the abrasion resisting layer 25 or on the anodic oxide film 23.

The housing 20 has been tested using an abrasion resistance tester (not shown). The test was carried out under a load of 175 g for 50 cycles. The test indicated that the housing 20 did not lose color (or be abraded) (observed by a 64 times optical microscope).

The abrasion resisting layer 25 may be formed by the following method.

The silane coupling agent water solution is manufactured. Isobutyl triethyl silane, isopropanol, ethanol, and deionized water with a volume ratio of 20:70:5:5 are mixed uniformly to form a mixture. Then acetic acid is added in the mixture to adjust the pH value of the mixture to about 4-5 to obtain the silane coupling agent water solution.

The nano $Al_2O_3$ powder is modified using an aluminate ester coupling agent. The nano $Al_2O_3$ powder, having a mass of about 100 g and an average particle size of about 30 nm-60 nm, is added in about 2 g-5 g of the aluminate ester coupling agent to be quickly agitated at 80° C.-100° C. for about 30 min-45 min.

About 3 g-5 g of the modified nano $Al_2O_3$ powder is added in about 95 g-100 g of the silane coupling agent water solution to mix uniformly for about 10 min-20 min, then applied to the anodic oxide film 23 to form the abrasion resisting layer 25 after being baked at an internal oven temperature of about 100° C. for about 10 min.

The anodic oxide film 23 can be formed by a conventional anodizing process.

It is believed that the exemplary embodiment and its advantages will be understood from the foregoing description, and it will be apparent that various changes may be made thereto without departing from the spirit and scope of the disclosure or sacrificing all of its advantages, the examples hereinbefore described merely being preferred or exemplary embodiment of the disclosure.

What is claimed is:

1. An electronic device, comprising:
   a main body; and
   a housing configured to assemble with the main body, the housing comprising:
   a substrate made of aluminum or aluminum alloy;
   an anodic oxide film disposed on the substrate; and
   an abrasion resisting layer disposed on the anodic oxide film, the abrasion resisting layer being an alkylate silicon dioxide layer comprising nano aluminum oxide powder.

2. The electronic device as claimed in claim 1, wherein Si—O—Si groups are formed at the interface of the alkylate silicon dioxide layer and the anodic oxide film.

3. The electronic device as claimed in claim 1, wherein the nano aluminum oxide powder comprises particles having an average diameter of about 30 nm to about 60 nm, the nano aluminum oxide powder has a mass percentage of about 60% to about 85% in the abrasion resisting layer.

4. The electronic device as claimed in claim 1, wherein the anodic oxide film defines a plurality of micro-pores, the nano-aluminum oxide powder fills the micro-pores and attaches on the anodic oxide film.

5. The electronic device as claimed in claim 1, wherein the anodic oxide film defines a plurality of micro-pores, the micro-pores are filled by colorant and sealing agent, the nano aluminum oxide powder attaches on the anodic oxide film.

6. The electronic device as claimed in claim 1, wherein the nano aluminum oxide powder is modified by an aluminate ester coupling agent.

* * * * *